(12) United States Patent
Ramirez et al.

(10) Patent No.: US 8,745,455 B2
(45) Date of Patent: Jun. 3, 2014

(54) PROVIDING AN ON-DIE LOGIC ANALYZER (ODLA) HAVING REDUCED COMMUNICATIONS

(75) Inventors: Ruben Ramirez, Hillsboro, OR (US); Michael J. Wiznerowicz, Hillsboro, OR (US); Sean T. Baartmans, Hillsboro, UT (US); Jason G. Sandri, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 663 days.

(21) Appl. No.: 12/952,822

(22) Filed: Nov. 23, 2010

(65) Prior Publication Data

US 2012/0131404 A1 May 24, 2012

(51) Int. Cl.
*G06F 11/00* (2006.01)
(52) U.S. Cl.
USPC .............................................. 714/733; 714/30
(58) Field of Classification Search
CPC ..... G06F 11/22; G06F 11/2205; G06F 11/25; G06F 11/27
See application file for complete search history.

(56) References Cited

U.S. PATENT DOCUMENTS

| | | | |
|---|---|---|---|
| 6,009,488 A | 12/1999 | Kavipurapu | |
| 7,009,533 B1 | 3/2006 | Wegener | |
| 7,944,234 B2 * | 5/2011 | Lunzer et al. | 326/38 |
| 2003/0126508 A1 * | 7/2003 | Litt | 714/39 |
| 2004/0250164 A1 * | 12/2004 | Ahmad et al. | 714/30 |
| 2006/0248397 A1 * | 11/2006 | Johnsen et al. | 714/30 |
| 2006/0255972 A1 * | 11/2006 | Swoboda | 341/50 |
| 2008/0163034 A1 | 7/2008 | Tate | |
| 2009/0031159 A1 * | 1/2009 | Luk et al. | 713/500 |
| 2009/0237110 A1 | 9/2009 | Lunzer et al. | |
| 2010/0115167 A1 | 5/2010 | Tardieux et al. | |

OTHER PUBLICATIONS

International Searching Authority, "Notification of Transmittal of the International Search Report and the Written Opinion of the International Searching Authority," mailed Jul. 23, 2012, in International application No. PCT/US2011/061979.

U.S. Appl. No. 12/541,472 entitled "On-Die Logic Analyzer For Semiconductor Device," filed Aug. 14, 2009, by Tina C. Zhong, et al.

* cited by examiner

*Primary Examiner* — Scott Baderman
*Assistant Examiner* — Jason Byran
(74) *Attorney, Agent, or Firm* — Trop, Pruner & Hu, P.C.

(57) ABSTRACT

In one embodiment, the present invention is directed to a logic analyzer such as may be implemented on a system-on-chip or another semiconductor device. The analyzer can include multiple lanes each having a filter to receive and filter debug data, a compressor to compress the debug data passed by the filter, a buffer, and a controller to store the compressed debug data into the buffer, where the compressed debug data can be stored without timing information. Other embodiments are described and claimed.

21 Claims, 8 Drawing Sheets

PROVIDING AN ON-DIE LOGIC ANALYZER (ODLA) HAVING REDUCED COMMUNICATIONS

BACKGROUND

As semiconductor technology advances, more and more functionality is provided within a single integrated circuit. This phenomenon exists not only for processors, controllers and other such devices, but also for so-called system on chip (SoC) devices. Such systems on chip include many different components including one or more internal processors or cores, controllers, interface circuitry, memories and so forth, such that the single integrated circuit acts as an entire embedded system.

Due to the large number of intellectual property (IP) blocks, with a diverse array of input/output ports and potentially several communication fabrics connecting everything together, the level of debug and validation capability must match this increase in complexity. There are a number of techniques available to enable the required level of debug and testing. However, one common technique uses an on-die logic analyzer (ODLA). With current debugging of SoC's whether by ODLA or other means, it can be difficult to match the debug needs with increasing design complexity. For example, buried interconnects are traditionally exposed to a set of re-usable functional package pins through a multiplexing structure. However, finding suitable package pins to re-use is becoming increasingly difficult and the fixed bandwidth of the port limits efficiency and throughput of the overall solution.

DETAILED DESCRIPTION

In various embodiments, an on-die logic analyzer (ODLA) may be provided to enable capture of debug information obtained from a plurality of different clock domains and to filter and compress the obtained data so that it can be provided to a desired location with minimal bandwidth consumption. Still further, to reduce the amount of data to be captured, stored and transmitted, virtually all of the data capture may be debug data. That is, this data may be captured and stored without associated timing information such as clock timing information or so forth. Embodiments may be designed to be flexible in matching the needs of an SoC proportionally to the need for the higher integration of current and future SoC components.

Accordingly, in various embodiments debug information may be coalesced through the use of filtering logic, store-on-change compression, and packetization. In this way, embodiments may be suitable for a variety of storage options. For example, in some embodiments the data collected may be provided to on-platform storage such as main memory or another dedicated memory. ODLA packetization can be optimized for a functional path through arbitration logic for storage in the system memory. However, since there are debug scenarios that may impede this path due to a functional bug, a set of re-usable package pins can be accessed.

Due to handling the packets in an independent clock domain, an ODLA in accordance with an embodiment of the present invention may improve debug data sent to package pins because packetization of the data makes the transfer bandwidth independent of the assigned port. If the port operates at a lower transfer rate, the buffer may simply drop packets. Even though the debug data is lossy, timestamp information may remain intact, allowing for accurate reconstruction of a trace. In some embodiments, the missing debug data can be marked in an extraction/display tool and a debugger can choose to re-run a debug test with different settings to improve trace collection.

Embodiments may further provide for efficient use of memory space and package pin bandwidth through use of sophisticated triggering on a front end and individual packets for sets of inputs that can be of different clock domains. Variable frequency clocks can be supported as long as they are turned off when there is a frequency change and the turn-off time is longer than the maximum clock period supported.

Figure 1:
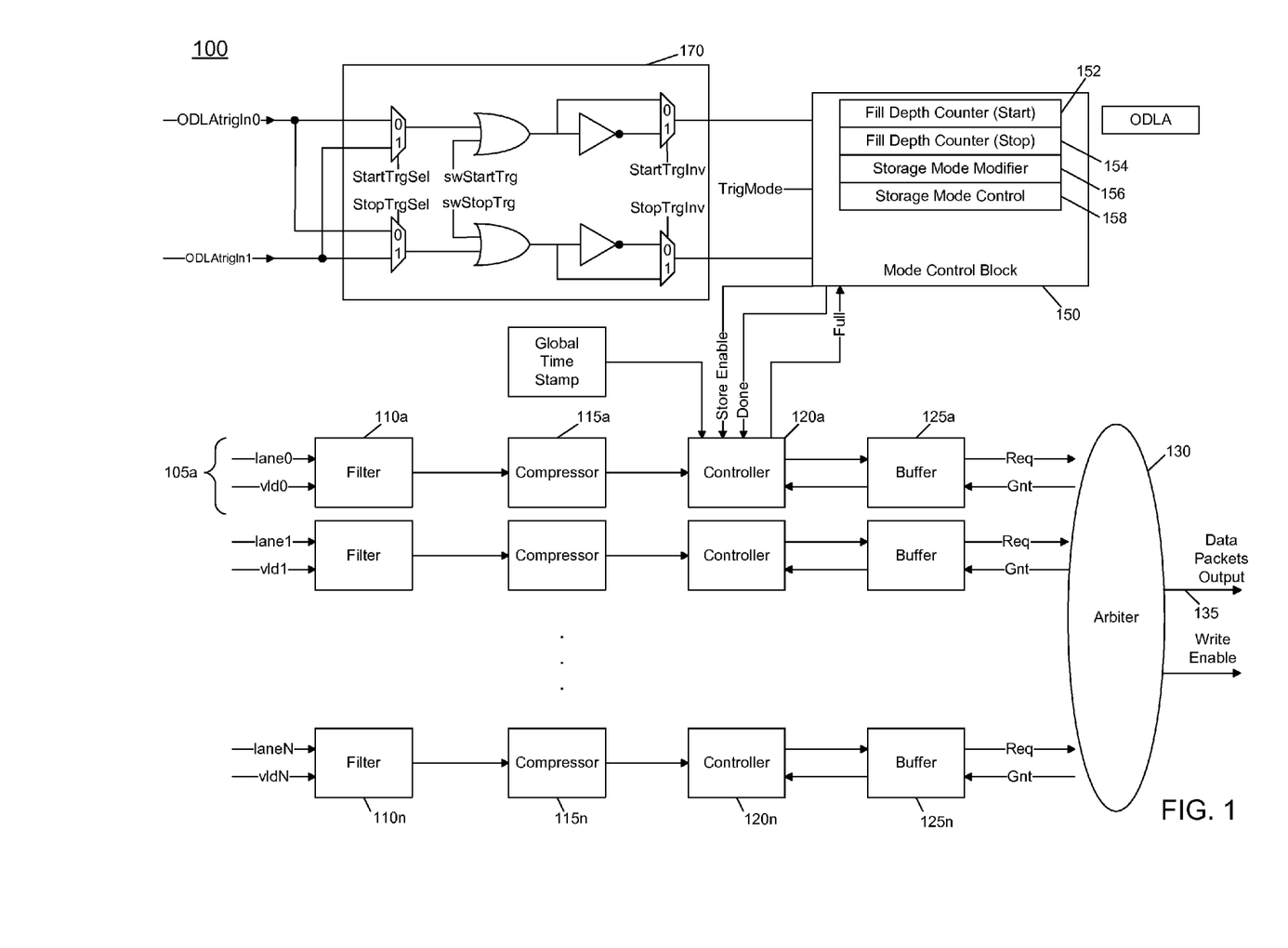
FIG. 1 is a block diagram of an on-die logic analyzer (ODLA) in accordance with an embodiment of the present invention.

Various features may be realized using an ODLA in accordance with an embodiment of the present invention. Referring now to FIG. 1, shown is a block diagram of an ODLA in accordance with an embodiment of the present invention. As shown in FIG. 1, ODLA 100 may be part of a semiconductor device that includes the ODLA. As examples, ODLA 100 may be part of a SoC, processor, controller, field programmable gate array or other programmable logic. As seen in FIG. 1, a plurality of lanes may be present, namely lanes 105a-105n (generally lane 105). Each lane may be configured to receive incoming data from a given portion of the chip. For example in the context of a SoC, one or more lanes each may be associated with a given core, interface logic, memory or so forth of the SoC. Reference will be made to the components of lane 105a, but understand that each lane may be similarly configured.

As seen in FIG. 1, lane 105 may receive incoming lane data, which may be of a desired width, e.g., byte wide data, in a filter 110a (generally filter 110). Filter 110 may be used to perform filtering such that only certain desired debug data is to be stored. Otherwise, the data may be discarded such that undesired data does not unnecessarily consume the limited resources available. In various embodiments, filter 110 has the filtering capability to either allow or disallow storage of a data sample based on a match/mask result for each byte lane. In this way the scope of what is stored for debugging or validation can be narrowed. For example, if a portion of an interface is to be traced, the filter logic can be used to only store debug data of a particular command type or everything but that command type. Samples that are stored based on a successful match criteria are referred to as being filtered "IN" and those that are purposely discarded are filtered "OUT".

Filter match/mask logic may operate on each lane independently of other lanes on a sample-by-sample basis.

After filtering, the filtered debug data may be provided to a compression logic block 115a (generally compressor 115). In various embodiments, compressor 115 may include a register to compare an incoming value of the debug data versus a previous sample of the debug data. Only if the comparison results in a mismatch is the data provided to a control block 120a (generally control block 120). That is, if a match occurs, the matching data need not be provided along for further processing and storage; instead only a sample counter (present in control block 120) may be updated based on this duplicative data.

Compression logic 115 thus may be configured to implement a store-on-change compression technique that only stores a lane data sample if it has changed from the previous lane sample stored. Lane samples that are exactly the same on subsequent samples will not be stored and hence all samples stored will represent a larger window of time than could otherwise be captured as individual samples. If the sample is compressed, a compressed cycle count corresponding to a number of samples of the same value will be inserted before a new sample value to keep track of how many samples were compressed to enable correct reconstruction of timing. In one embodiment, if the number of compressed cycles exceeds 255, no more samples are to be counted and a timestamp packet will be stored with value of the 256th sample. If the sample value changes afterwards then another timestamp packet will be stored before the new sample is stored as well.

As will be discussed further below, control block 120 may perform various control operations based on signals received from other portions of the ODLA. Control unit 120 may be responsible for storing data samples in data packets and generating the appropriate timestamp and buffer overflow packets so that timing can be reconstructed. As shown in FIG. 1, control block 120 may receive a global timestamp value from a global timestamp unit 140, may receive control signals from a mode control block 150, and may provide status information, e.g., a full signal to mode control block 150. Global timestamp block 140 may be a free-running 32, 40, or 48-bit counter having a selectable size, in various embodiments.

As further shown in FIG. 1, when control unit 120 determines that a valid debug data should be stored, the valid data is provided to a buffer 125a (generally buffer 125). Note that when buffer 125 is full, a full signal may be provided back to control block 120 which prevents further passing of data while the buffer remains full. Accordingly, control unit 120 may drop data in a full buffer condition scenario. Note that in various embodiments, control block 120 stores valid data internally until a data packet is complete. Once a data packet is complete, it is stored in buffer 125. If buffer 125 becomes full, control block 120 starts dropping data packets and keeps a count of how many samples were lost in each data packet. Once buffer 125 becomes empty, control block 120 may then store a buffer overflow packet with the count of samples lost and thereafter resume storing of data packets in buffer 125.

As seen in FIG. 1, buffer 125 is in communication with an arbiter 130. In various embodiments, buffer 125 may generate request signals to the arbiter to request output of data when it is available and ready to be output. In turn, arbiter 130 may generate a grant signal and provide it to a corresponding buffer when that buffer is granted access to an output line 135. Accordingly, when a grant is received, buffer 125 may provide a data packet through arbiter 130 and to line 135 as a data output packet. In addition as seen, arbiter 130 may further provide a write enable signal to an interface that can either send packets to main memory or package pins. Arbiter 130 may operate with a priority scheme to select the order in which packets from each byte lane are provided.

As further seen in FIG. 1, a trigger logic 170 may be present to receive incoming trigger signals from a trigger processor that has multiple input signals in the SoC. In general, trigger logic 170 may include multiplexers, logic circuitry and so forth to thus generate trigger signals that are provided, along with a trigger mode signal, to a mode control block 150. In the embodiment of FIG. 1, mode control block 150 may further include various controllers, counters and modifiers. Specifically, in the embodiment shown is a fill depth counter 152 that acts as a start counter and a fill depth counter 154 that acts as a stop counter. In addition, mode control block 150 may further include a storage mode modifier 156 and a storage mode control 158. While shown with this particular implementation in the embodiment of FIG. 1, understand the scope of the present invention is not limited this regard. That is, in other embodiments an ODLA may have a different structure.

In various embodiments, the lanes may be configured to capture data in groups of 8 bits, i.e., a byte-based capture. Each byte lane 105 may run on its own clock domain speed and its data is filtered, compressed and packetized independently from other lanes. Nevertheless, data can be reconstructed accurately even it is filtered and compressed simultaneously. In addition, timing can be reconstructed using at least two timestamps and counting the exact number of data samples in between, assuming periodic data. Note that variable frequency clocks are supported as long as they are turned off when there is a frequency change and the turn-off time is longer than the maximum clock period supported. Accordingly, an ODLA in accordance with an embodiment of the present invention may optimize output bandwidth by accommodating characteristics implemented in a modular and scalable design.

In various embodiments, mode control block 150 may generate a store enable signal that initiates and stops capture of data on all lanes. In addition, mode control block 150 may support a plurality of trigger storage modes and modifiers. As examples, the triggers may include: a start trigger, responsive to which data capture begins with a start trigger assertion until the modifier condition stop capture or memory is full; a start re-trigger, in which data capture begins with a start trigger assertion until the modifier condition stop capture, and waits for another trigger until memory is full; a stop trigger, responsive to which continuous data capture occurs until a stop trigger event, then until the modifier condition is true; a window mode, responsive to which data capture occurs between the start and stop triggers with modifier conditions; a window re-trigger mode in which data capture occurs between the start and stop triggers with modifier conditions, waits for another trigger set until memory full; and a repeated start trigger final stop in which data capture begins with a start trigger assertion until the modifier condition stop capture, waits for another trigger until stop trigger event or memory is full. In one embodiment, trigger modifiers may include: level sensitivity; fill depth counter and invert sensitivity. Level sensitivity may be used to start capture on the rising edge and stop capture on the falling edge of the trigger. The fill depth counter defines how many samples on the trigger clock domain are to be captured after the trigger. The invert sensitivity selects the trigger edge direction; in one embodiment, without inversion the direction is rising edge, and inverted is falling edge.

Figure 2:
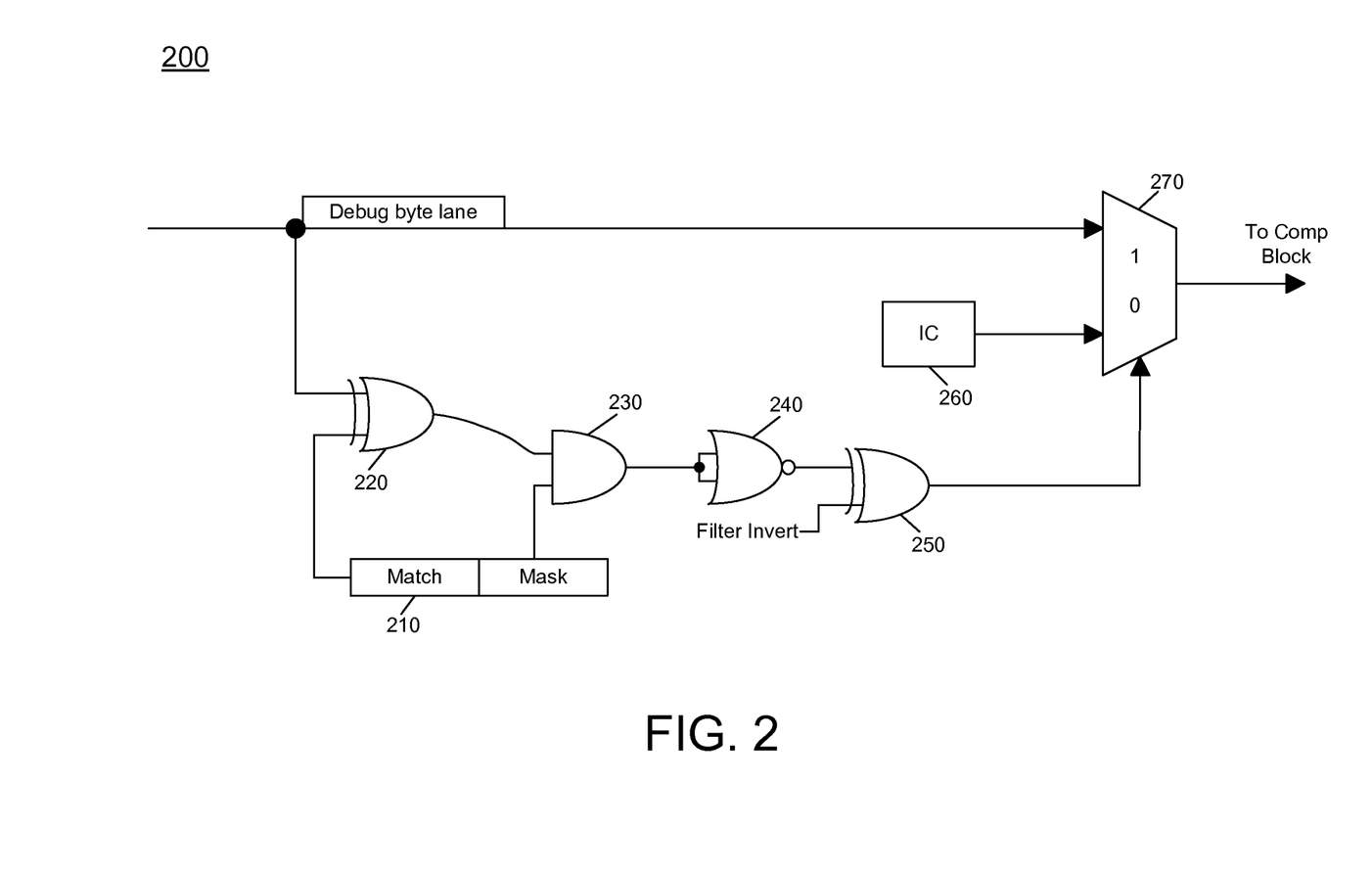
FIG. 2 is a schematic diagram of a filter logic in accordance with an embodiment of the present invention.

Referring now to FIG. 2, shown is a schematic diagram of a filter logic in accordance with an embodiment of the present invention. As shown in FIG. 2, filter logic 200 may correspond to filter 110 of FIG. 1. As seen, incoming debug data for the lane may be provided both to a multiplexer 270 and a first logic gate 220 which in the embodiment shown may be an exclusive-OR (XOR) gate 220. As further seen, logic 220 is coupled to receive a match portion of a match/mask unit 210. The corresponding output from logic 220 may be provided to a second logic 230 which in the embodiment shown is an AND gate coupled to receive the mask portion of match/mask unit 210. The corresponding output of second logic 230 may be provided to a third logic 240 which in the embodiment shown may be a NOR gate corresponding to an 8:1 NOR tree to thus generate a single output provided to a fourth logic 250 which in the embodiment shown is another XOR gate further coupled to receive a filter invert signal. The corresponding output of this logic gate may thus control multiplexer 270. As further seen, a second input to multiplexer 270 may be received from an invalid code unit 260. While shown with this particular implementation in the embodiment of FIG. 2, understand that other configurations are possible.

Thus each byte lane has a match/mask block 210 whose output is used to select either the data path or an invalid code (IC), described later. Note that the filter logic works with the compression logic to store only the values needed to reconstruct the trace in software. However, filtering with compression could raise an issue in trying to distinguish the difference between a set of stored filter IN samples and the compressed space between non-changing data samples. Thus in various embodiments, a deterministic encoded data symbol may be inserted into the processing path and stored into the trace buffer to provide hints to the software to know when the end of compression occurred on the filtered IN samples. This data is called an invalid code (IC) and it contains a code based on the setting in each byte lane's match/mask values. A per lane 8-bit match value may be used by the filter logic to determine if the sample is to be stored or not. A corresponding mask value may be used to calculate an overall match value for the current debug sample. In one embodiment, the mask value is an 8-bit field (1 bit per corresponding match value bit) that indicates if this bit should or should not be considered by the filter logic when determining if there is a match for this sample. If the mask bit is set, the corresponding match bit is used to determine a match. If the mask bit is cleared, the corresponding match bit is not used to determine a match and becomes a don't care condition. The contents of the Invalid Code pattern may be a bitwise logical operation of the inverted match value AND'ed with the mask value. In one embodiment, the following may define the invalid code:

Invalid Code=!(Match value) AND (Mask value).

Any mismatches in the match data bits that are not masked guarantees that the byte is invalid. Reconstruction software is made aware of the mask/match/invert filter values that the user defines as it configures each lane so that it can identify a location of filtered debug data. Since it was given this knowledge it can decode the extracted trace buffer data and determine where the invalid codes existed. Therefore, if the specified pattern does not exist in the data, it is an invalid pattern and software will disregard this data.

Figure 3:
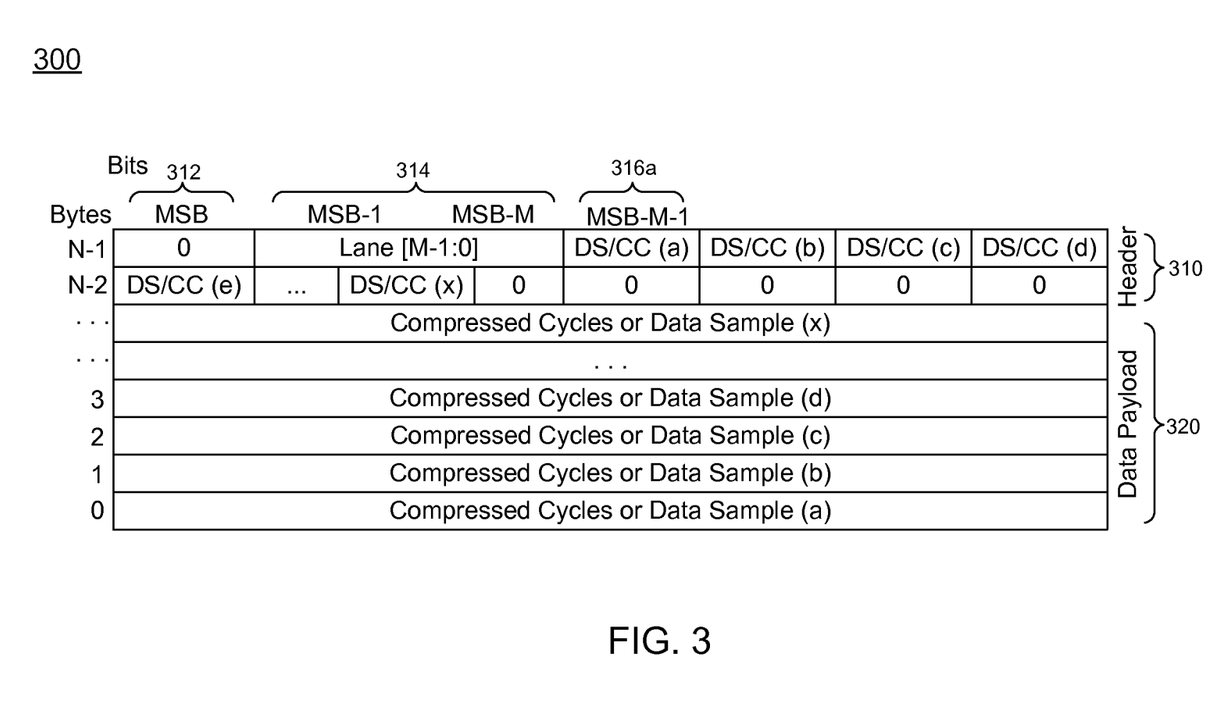
FIG. 3 is a block diagram of a data packet format in accordance with one embodiment of the present invention.

Referring now to FIG. 3, shown is a block diagram of a data packet format in accordance with an embodiment of the present invention. As shown in FIG. 3, data packet 300 includes a header 310 and a data payload 320. Depending on the amount of data to be provided, a data packet in accordance with an embodiment present invention can be of different sizes. In general, header 310 may include various information to indicate the type of data packet, as well as to provide information regarding the configuration of the ODLA (e.g., the lane number, and the amount of the data provided in the packet. Specifically in the embodiment shown in FIG. 3 header 310 may include a data type indicator 312 to indicate the type of data packet, a lane configuration field 314 to indicate the number of the lane corresponding to the data packet, and a plurality of data ordering fields, each associated with a given portion of the data packet to indicate the order of data samples and compressed cycles within the data payload packet. As further seen, data payload 320 may include a plurality of individual data packet portions for the corresponding lane, each including compressed cycles or data samples.

Each lane's data is stored in separate data packets that contain a header and a data payload. Only one data packet is stored in a memory or storage buffer line and the packet width is the same as the memory or storage line, in one embodiment. For graphical purposes, in FIG. 3 a packet is shown as a stack of bytes, starting from the header in the most significant bit (MSB) down to the least significant bit (LSB). A memory or temporary storage buffer line is the number of bytes stored at one time per address. The MSB of the header (field 312) indicates whether this is a data packet (0) or a special packet (1). Then next bits of the header (field 314) is the lane number field which in one embodiment may select up to 16 byte lanes, however a higher number of lanes is possible. This value may be customized from one to four bits for a total of 16 byte lanes but there is not a practical limit. Following the lane number field are a set N-number of order bits. This data ordering (DS/CC) bit field 316 (a single bit of which is identified as 316*a*) indicates the order of data samples (DS), where (DS)=logic 1 and compressed cycle bytes (CC)=logic 0 within the packet payload. The number of data ordering bits (n) is the number of bytes that can fit within the data packet payload field. Hardware and software may calculate this value with the following equation:

Data Ordering bits=Integer((Memory Line bits−Lane Number bits−1)/9).

While shown this particular implementation in the embodiment of FIG. 3, understand the scope of the present invention is not limited in this regard.

Figure 4:
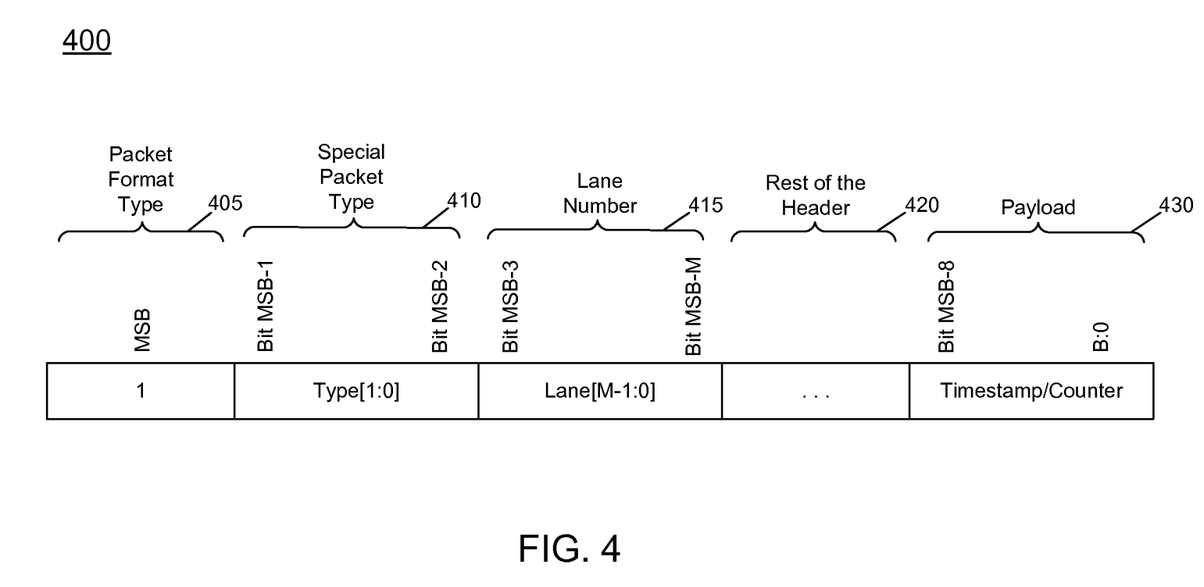
FIG. 4 is a block diagram illustrating an example format for a special packet in accordance with an embodiment of the present invention.

Referring now to FIG. 4, shown is a block diagram illustrating an example format for a special packet in accordance with an embodiment of the present invention. As shown in FIG. 4, special packet 400 includes a plurality of fields, including a packet format type field 405, a special packet type field 410, a lane number field 415, a header delimiter portion 420, and a payload portion 430. Special packets can be of different types, including a regular timestamp (RT), last timestamp (LT), or a buffer overflow (BO).

The MSB field 405 in the header indicates a special packet when it is logic 1. Both data and special packets can have the same size and they can be 4 or more bytes long and headers can be aligned with the MSB of the memory line entry. Following the MSB bit (MSB-1:MSB-2), there is a special packet type field 410 of two bits that identifies the special packet type. In one embodiment, type 00 is a regular timestamp (RT) that marks the absolute time of the first lane sample in the next data packet: there is at least one RT per lane, more may be present in case the first RT is lost like in stop trigger mode and to have a more accurate timing reconstruction. If there are no data samples between two RTs, idle data is assumed between these two timestamps. In this embodiment, type 01 is a last timestamp (LT), and is the same as an RT. The only difference is that this type indicates the absolute time of the last lane sample in the previous data packet. No more data is stored after it until there is a new RT. Type 10 is a Buffer Overflow (BO), which is stored whenever a data packet is lost due to buffer full condition. It keeps a count of the number of samples lost since the last successful stored data packet so timing can be reconstructed. Then the lane number field 415 (MSB-1: MSB-M) is provided, where M=(log 2(LANE-NUM)), and the remainder of the header byte can be filled with zeroes as a delimiter field 420, after which a payload portion provides the timestamp/counter information.

Figure 5:
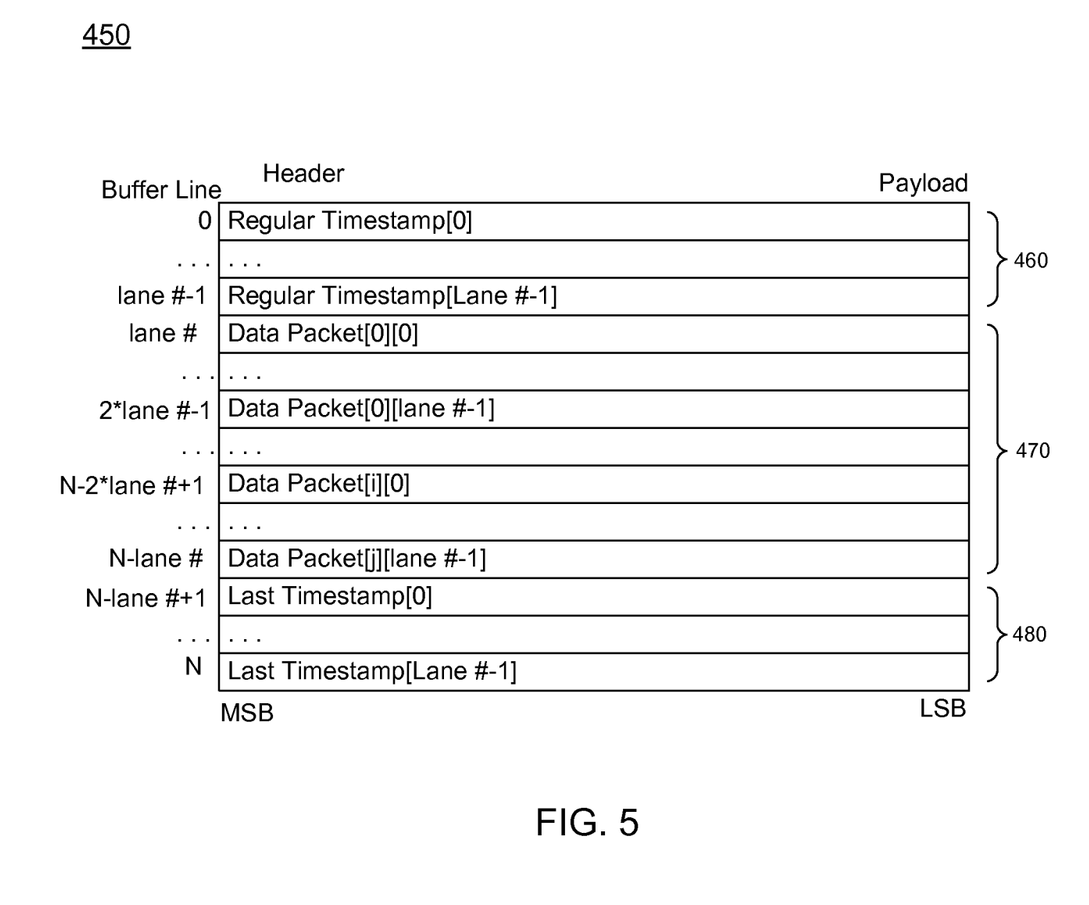
FIG. 5 is a block diagram of a portion of a memory storing data between timestamp packets in accordance with an embodiment of the present tense.

FIG. 5 is a block diagram of a portion of a memory storing data and timestamp packets in accordance with an embodiment of the present invention. Shown in FIG. 5, buffer 450 may correspond to a trace buffer for a trace that is under debug. As seen, buffer 450 may include a plurality of lines, each including information regarding timestamps or data. In the implementation shown in FIG. 5, a first portion 460 may store regular timestamps for each of the lanes, then the corresponding data packets for the lanes may be stored in a second portion 470, and finally a last timestamp for each of the lanes may be stored in a third portion 480. While shown with this particular ordering of information stored in the trace buffer of FIG. 5, understand that other implementations are possible.

Special packets may be inserted into the trace buffer to provide the post processing software with sufficient information to reconstruct and align the data in time. Because data lane samples do not carry any other information, time references and location information when data has been continuously captured can be provided, where a lane has been idle and where no data has been captured. Timing can be reconstructed by determining the delta time between samples on a lane as follows: Delta t=(Last Sample Timestamp−First Sample Timestamp)/(Number of Samples−1).

Figure 6:
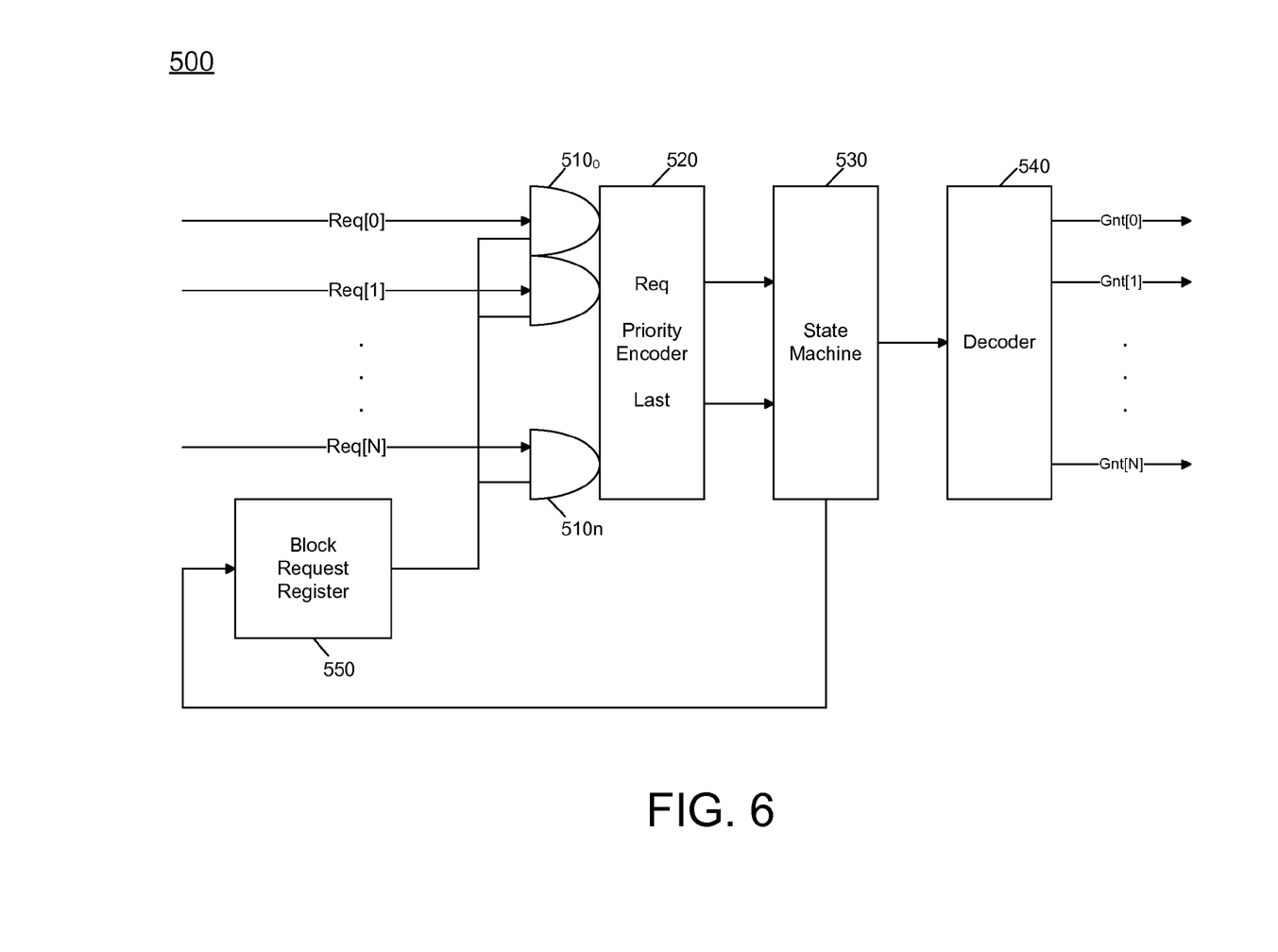
FIG. 6 is a block diagram of an arbiter in accordance with one embodiment of the present invention.

In one embodiment, an arbiter may employ a fast request and grant scheme to service each lane that has data ready to send. While different implementations of an arbiter are possible, referring now to FIG. 6, shown is a block diagram of an arbiter in accordance with one embodiment of the present invention. As shown in FIG. 6, arbiter 500 may be configured to receive a plurality of incoming requests, each provided to a corresponding logic gate $510_0$-$510_n$, each of which may correspond to an AND gate. In addition, each of the gates receives an output from a block request register 550. Based on these inputs, each AND gate may send an output to a priority encoder 520, which generates a priority grant for the highest priority requester, and provides that request on a request output line to a state machine 530. As further seen, priority encoder 520 further provides a last signal to state machine 530. In turn, state machine 530 may process this information and provide a grant, which is provided to a decoder 540 which in turn generates a corresponding grant signal to be provided to the selected requester. In addition, state machine 530 may provide a control signal to block request register 550, e.g., based on receipt of the last signal from priority encoder 520. While shown with this particular implementation in the embodiment of FIG. 6, understand the scope of the present invention is not limited in this regard.

Thus as shown in FIG. 6, requests from each lane controller are encoded in priority encoder 520, state machine 530 grants the corresponding request, blocks it and then it goes to the next lane request. When all lanes with pending requests are serviced, they are unblocked and then arbiter 500 is ready to grant new requests. In this way, it may be ensured that every lane is serviced equally and continuously from lane to lane without idle cycles. Additional grants per lane can be enabled by setting back-to-back transaction credits, e.g., up to 3 credits per lane, which can be used where there is more than one packet stored in the internal buffer. In one embodiment, a credit is used for each additional back-to-back grant. Using an arbiter in accordance with an embodiment of the present invention, packets may compete for offload access, and data from lanes having less priority can be dropped.

Figure 7:
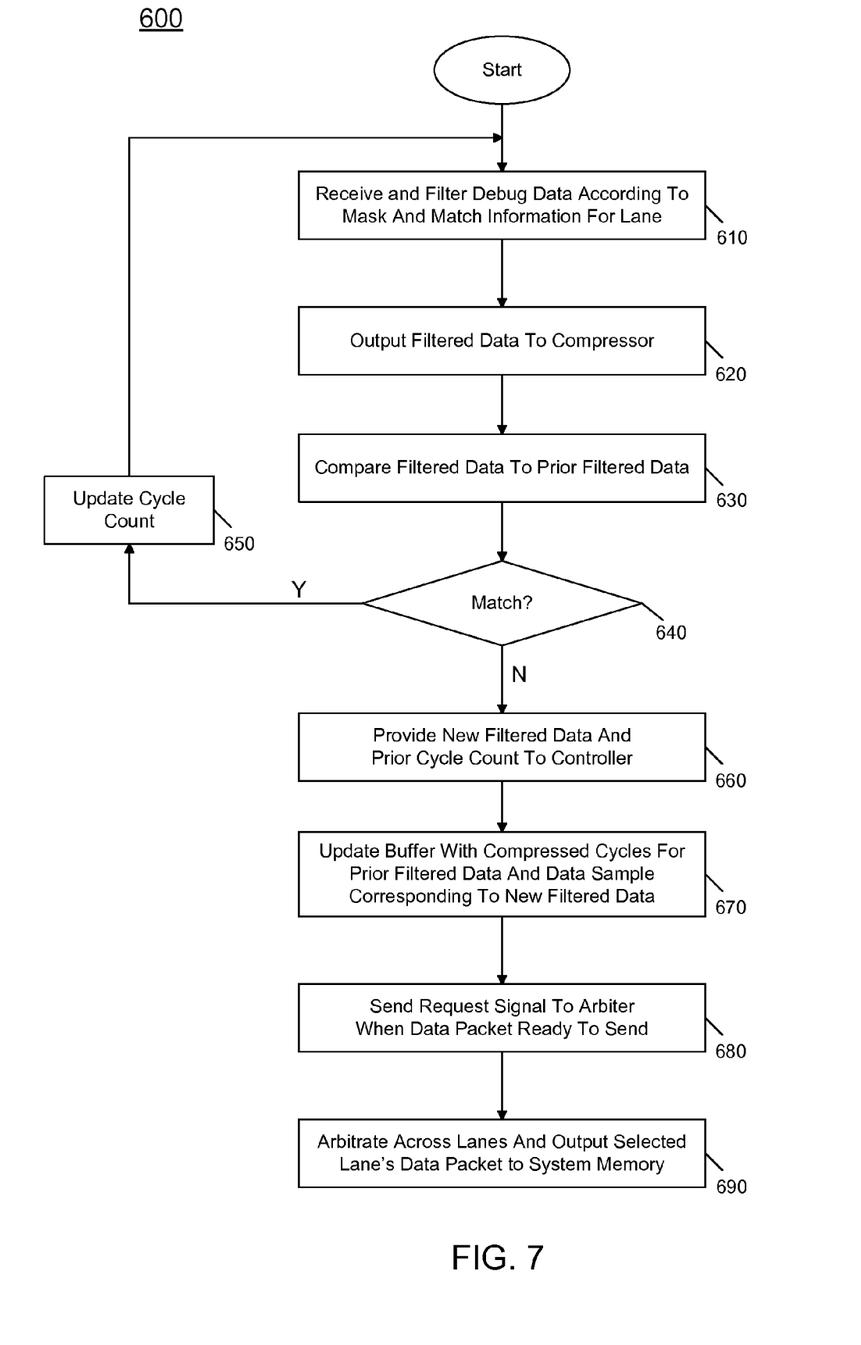
FIG. 7 is a flow diagram of a method in accordance with one embodiment of the present invention.

Referring now to FIG. 7, shown is a flow diagram of a method in accordance with an embodiment of the present invention. As shown in FIG. 7, method 600 may be used to receive and process incoming debug data in an ODLA. As seen, method 600 may begin by receiving and filtering debug data according to mask and match information for a lane (block 610). That is, a data pattern of incoming debug data for a given lane may be compared to the mask and match information for the corresponding lane to determine whether the debug data should be filtered in or out.

If it is determined that the data should be filtered in, the data is provided to a compressor (block 620). In the compressor, the filtered data may be compared to prior filtered data (block 630). That is, if the current data sample is the same value as the previous data sample, there is no need to separately store the most recent data sample. Accordingly at diamond 640 it may be determined whether a match occurs. If so, control passes to block 650 where a cycle count may be updated. This cycle count may correspond to a count of consecutive data samples for the lane having the same value. In such instance, control passes back to block 610.

If instead at diamond 640 it is determined that a match does not occur, control passes to block 660. At block 660 the new data sample along with the prior cycle count may be provided to a controller. The controller may perform various processing on this information, and then update a buffer. More specifically at block 670 the controller may update the buffer with a compressed cycle count for the prior data, along with the new data sample to be stored in the buffer. When the buffer hits a certain fill level, e.g., a predetermined threshold level, it may send a request signal to an arbiter to indicate that it has a data packet ready for sending (block 680). Further, packets internally stored in the control block may begin to be dropped, and a count of lost samples maintained until space in the buffer becomes available. Then the control block can provide a buffer overflow packet with a count of lost samples. Control then passes to block 690 where the arbiter may arbitrate across various lanes of the ODLA to output a selected lane's data packet to a system memory. Note that by sending the data to a system memory instead of on die storage associated with the ODLA, a reduced size for the ODLA and improved storage within a trace buffer of the system memory can occur. While shown with this particular implementation in the embodiment of FIG. 7, understand the scope of the present invention is not limited in this regard.

While the basic operations for receiving and processing debug data are shown in FIG. 7, other operations can be possible. For example, in some implementations, a capture can begin and may have a timestamp stored somewhere in the middle of the capture. Then the capture may finish and this completion may be associated another timestamp. As long as there are two timestamps and the number of samples in between is known, a clock period can be calculated and timing reconstructed for all the lane samples in that capture. Further, when channel congestion is present, one or more data samples can be discarded. Such discarded samples can be counted and this count stored in buffer overflow packets so that timing can be reconstructed by a receiver of the trace data, e.g., reconstruction software.

An ODLA in accordance with an embodiment of the present invention may thus solve the problem of requiring additional observability of internal events and trace information necessary by the increased level of SoC integration while making better use of reusable package pins available. Further, by providing access to on-platform main memory, efficient data capture with multiple clock domains can occur that minimizes system disturbance without the need for a dedicated on-die storage memory. Filtering and compression in accordance with an embodiment of the present invention may use encoded data, and further provide the ability to count compressed and lost data samples. Still further, data packets may be processed, stored, and transmitted from the ODLA without timing information, reducing packet overhead. Also, by providing independent capture of data by byte-lanes at independent clock domain speeds, filtering, compression and data packing efficiency can be improved.

ODLAs according to various embodiments may be architected with modularity such that a range of parameters scales sub-components linearly so that software tools written for the ODLA will automatically scale with the design, enabling one source code tool to be written while different SoC designs may require a different number of tracing lanes.

Figure 8:
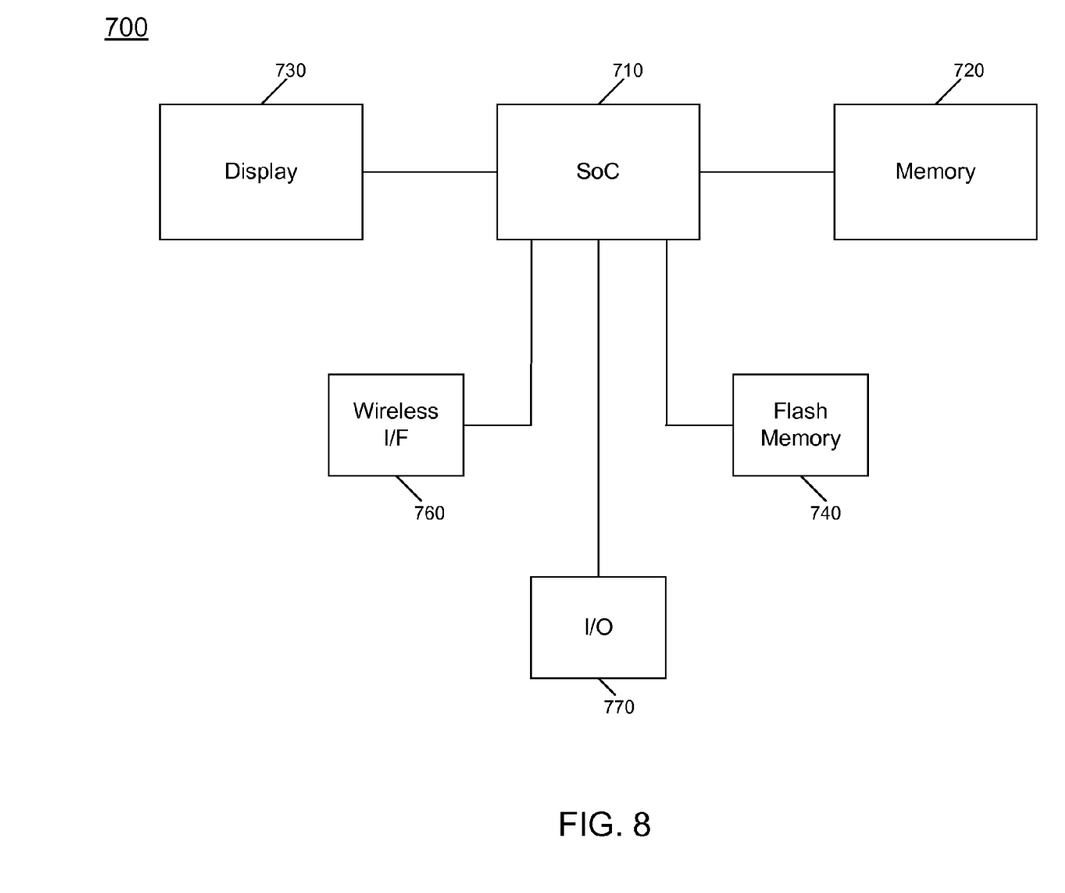
FIG. 8 is a block diagram of a system in accordance with one embodiment of the present invention.

Note that an SoC in accordance with an embodiment of the present invention may be of various types of designs including multi-core and many-core processor designs with additional agents such as cores, caches, accelerators, memory controllers and so forth. SoCs can be used in many different systems. As one particular example, a SoC in accordance with an embodiment of the present invention can be incorporated into a computer system such as a netbook computer. Referring now to FIG. 8, shown is a block diagram of a system in accordance with one embodiment of the present invention. As shown in FIG. 8, system 700 may be a netbook or other small form factor computer such as a tablet computer.

A memory 720, which in one embodiment may be dynamic random access memory (DRAM), may be coupled to a SoC 710, as the SoC may include an integrated memory controller along with an ODLA in accordance with an embodiment of the present invention. In addition, SoC 710 may be coupled to a display 730 such as a liquid crystal display (LCD) or other such display, as the SoC may further include graphics functionality. In addition, SoC 710 may couple to various system components such as a flash memory 740 which in one embodiment may act as a mass storage system for the system, as its small form factor may be appropriate for a netbook or other small device. In addition, the SoC may include a network interface that can in turn couple to one or more off-chip devices such as a wireless interface 760 that may enable communication, e.g., via a local area network (LAN) such as a Bluetooth™ connection, a wireless LAN (WLAN) in accordance with Institute of Electrical and Electronics Engineers (IEEE) 802.11 or another such standard. In addition, wireless interface 760 may further enable communication via a wide area network such as a cellular communication network. The SoC may further couple to one or more IO devices 770 such as a keyboard, mouse, pointer or other user interface device. While shown with this particular implementation in the embodiment of FIG. 8, the scope of the present invention is not limited in this regard.

Embodiments may be implemented in code and may be stored on a storage medium having stored thereon instructions which can be used to program a system to perform the instructions. The storage medium may include, but is not limited to, any type of non-transitory storage medium such as disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a plurality of lanes, each lane including:
        a filter to receive debug data and to filter the debug data,
        a compressor to compress the debug data that is passed by the filter;
        a buffer, wherein the buffer is to store for a first lane a first time stamp and a second time stamp in a data packet, wherein the first time stamp corresponds to a global time stamp at receipt of a first debug data and the second time stamp corresponds to receipt of a last debug data, and wherein the data packet includes a plurality of data samples received in the first lane during a window between the first and second time stamps; and
        a controller to store the compressed debug data into the buffer, the compressed debug data to be stored without timing information associated therewith; and
        an arbiter coupled to an output of each the plurality of lanes to select one of the lanes to output information therefrom.

2. The apparatus of claim 1, wherein each of the plurality of lanes is of a different clock domain and is to operate at an independent clock rate.

3. The apparatus of claim 1, wherein the filter is to pass the debug data to the compressor only if the debug data corresponds to a predetermined value.

4. The apparatus of claim 3, wherein the filter is to output an invalid code corresponding to an invalid data value for the corresponding lane if the debug data is to be filtered and to not output the debug data, the invalid code usable by a reconstruction tool to identify a location of filtered debug data.

5. The apparatus of claim 4, wherein the compressor is to compare a second debug data to a previous debug data and to indicate a match to the controller if the second debug data and the previous debug data match, and wherein the controller is to not store the second debug data in the buffer if the match occurs.

6. The apparatus of claim 1, wherein the controller is to control storage of a data packet into the buffer, the data packet including a header and a data portion, the header having an order field to indicate whether a corresponding portion of the data portion includes a compressed cycle count or a compressed debug data.

7. The apparatus of claim 6, wherein the compressed cycle count corresponds to a number of consecutive data samples received in the lane having the same value.

8. The apparatus of claim 1, wherein the buffer is to store a buffer overflow packet to identify a location and timing of lost data samples of a lane, the lost data samples due to congestion in the lane.

9. The apparatus of claim 1, wherein the apparatus comprises an on-die logic analyzer (ODLA).

10. The apparatus of claim 9, wherein the ODLA does not include an on-die memory, and wherein information from the buffers is to be provided to a trace buffer stored in a system memory coupled to the ODLA.

11. A method comprising:
receiving debug data in a filter of a lane of a plurality of lanes of an on-die logic analyzer (ODLA);
determining in the filter whether the debug data corresponds to a data pattern to be stored, based on mask information and match information associated with the lane;
if so, providing the debug data to a compressor of the lane, and otherwise discarding the debug data;
determining in the compressor whether the debug data matches a prior debug data sample, and if so updating a cycle count, and otherwise providing the debug data and the cycle count to a controller of the lane;
updating a buffer of the lane with the cycle count and the debug data;
sending a request signal to an arbiter of the ODLA to request access to an interconnect coupled to the ODLA when a data packet is ready to be transmitted from the buffer; and
selecting in the arbiter the buffer for access to the interconnect from a plurality of buffers seeking the access, and sending a grant signal from the arbiter to the selected buffer.

12. The method of claim 11, further comprising transmitting the data packet to a system memory coupled to the ODLA via the interconnect, wherein the ODLA does not include an on-die memory for storage of trace data.

13. The method of claim 11, further comprising dropping at least one debug data due to congestion, and identifying the at least one dropped debug data using a buffer overflow packet, and storing the buffer overflow packet in the buffer, wherein a reconstruction tool is to reconstruct an incoming debug data stream using the buffer overflow packet.

14. The method of claim 11, further comprising storing, in a buffer of a first lane, a first time stamp and a second time stamp in a data packet, wherein the first time stamp corresponds to a global time stamp at receipt of a first debug data and the second time stamp corresponds to receipt of a last debug data, and wherein the data packet includes a plurality of data samples received in the first lane during a window between the first and second time stamps.

15. The method of claim 14, further comprising storing, in the buffer of the first lane, a buffer overflow packet to identify a location and timing of lost data samples of the first lane, the lost data samples due to congestion in the first lane.

16. A system comprising:
a system-on-a-chip (SoC) having at least one core and an on-die logic analyzer (ODLA) coupled to the at least one core and including a plurality of lanes each of a different clock domain, each lane including:
a filter to receive debug data and to filter the debug data;
a compressor to compress the debug data that is passed by the filter;
a buffer; and
a controller to store the compressed debug data into the buffer, the compressed debug data to be stored without timing information associated therewith;
the SoC further having an arbiter coupled to an output of each of the plurality of lanes to receive request signals from each of the plurality of lanes, the request signals to indicate that the corresponding lane is ready to output information therefrom, to arbitrate among the request signals, and to output a grant signal to one of the lanes to select the one of the lanes to output the information therefrom; and
a system memory coupled to the ODLA.

17. The system of claim 16, wherein the filter is to pass the debug data to the compressor only if the debug data corresponds to a predetermined value, and to output an invalid code corresponding to an invalid data value for the corresponding lane if the debug data is to be filtered, the invalid code usable by reconstruction software to identify a location of filtered debug data.

18. The system of claim 16, wherein the compressor is to compare a second debug data to a previous debug data and to indicate a match to the controller if the second debug data and the previous debug data match, and wherein the controller is to not store the second debug data in the buffer if the match occurs.

19. The system of claim 16, wherein the buffer is to store a packet having a selected one of buffer overflow information, timing information, or data information, wherein the data information is stored without the timing information.

20. The system of claim 16, wherein a first buffer of a first lane is to store a first time stamp and a second time stamp in a data packet, wherein the first time stamp corresponds to a global time stamp at receipt of a first debug data and the second time stamp corresponds to receipt of a last debug data, and wherein the data packet includes a plurality of data samples received in the first lane during a window between the first and second time stamps.

21. The system of claim 20, wherein the first buffer is to store a buffer overflow packet to identify a location and timing of lost data samples of the first lane, the lost data samples due to congestion in the first lane.

\* \* \* \* \*